United States Patent [19]

Hirabayashi

[11] Patent Number: 4,802,163

[45] Date of Patent: Jan. 31, 1989

[54] TEST-FACILITATING CIRCUIT AND TESTING METHOD

[75] Inventor: Kanji Hirabayashi, Sagamihara, Japan

[73] Assignee: Kabushiki Kaisha Toshiba, Kawasaki, Japan

[21] Appl. No.: 947,092

[22] Filed: Dec. 29, 1986

[30] Foreign Application Priority Data

Mar. 10, 1986 [JP] Japan .................................. 61-50407

[51] Int. Cl.⁴ ............................................ G01R 31/28

[52] U.S. Cl. ...................................................... 371/15

[58] Field of Search ........................ 371/15, 16, 25, 27; 324/73 R, 73 AT; 364/200 MS File, 900 MS File

[56] References Cited

U.S. PATENT DOCUMENTS 3,783,254 1/1974 Eichelberger ........................ 235/152
4,074,851 2/1978 Eichelberger ............. 324/73 AT X
4,519,078 5/1985 Komonytsky ........................ 371/25
4,580,137 4/1986 Fiedler .............................. 371/25 X
4,606,024 8/1986 Glass ................................. 371/18 X
4,691,161 9/1987 Kant .................................. 371/15 X
4,701,921 10/1987 Powell ................................. 371/25

OTHER PUBLICATIONS

IEEE 1985 Custom Integrated Circuits Conference, Toshiba Microcomputer Engineering Corp., (Nagao et al.), CH2157-6/85/0000-0267, p. 267 through 271, entitled "Super Integration".

*Primary Examiner*—Jerry Smith
*Assistant Examiner*—Robert W. Beausoliel
*Attorney, Agent, or Firm*—Foley & Lardner, Schwartz, Jeffery, Schwaab, Mack, Blumenthal & Evans

[57] ABSTRACT

A test-facilitating circuit comprises a circuit of superior level in hierarchy constructed by connecting the circuit modules and taking out external nodes from predetermined circuit modules, an interposed gate provided for the input-output portions of each circuit module, an input gate an an output gate provided for a wiring between the interposed gates, with the mutual wiring as one of their ends, a device which connects the input terminal of an input gate to the input external node of the circuit module that does not belong to the circuit modules on the output side of the mutual wiring, a device which connects the output terminal of an output gate to the output external node of the circuit module that does not belong to the circuit modules on the input side of the mutual wiring, and a rewritable memory device provided for the control terminal of each interposed gate, input gate, and output gate. The test of a circuit module is carried out by selectively activating the interposed gate, input gate, and output gate that belong to the same circuit module, and by making use of the external nodes of other circuit modules connected to the external nodes and the input gate and the output gate that belong to the circuit module.

18 Claims, 5 Drawing Sheets

P4 SO SI P5
P3 M2 M3 P6
15 17 F6 F1 20
F5 F2 16
18 13 F4 F3 19 14
M 1
11 12
P2 P1

TEST-FACILITATING CIRCUIT AND TESTING METHOD

BACKGROUND OF THE INVENTION

Field of the Invention

The present invention relates to an integrated circuit for facilitating tests.

Description of the Prior Art

In making large-scale circuits design facilitation by hierarchy has been attempted. However, hierarchy of tests cannot always be accomplished because there are cases in which the preparation of test data is a bottleneck. In addition, there are occurring an increasing number of cases in which circuits with larger scale including the already developed chips are being made. In such a case, the test data on the already developed chips cannot be reused although their design data can be reused.

In order to reuse the test data of the already developed chips, it is necessary to come up with a systematic method which enables the hierarchy of tests. Once a hierarchy of tests becomes feasible, then specification of defective portion becomes easy not only because of the facilitation in the preparation of the test data including the reuse of the test data but also of the possibility of realizing a defect analysis by hierarchy.

SUMMARY OF THE INVENTION

Accordingly, an object of the present invention is to provide a test-facilitating circuit, and the relevant test method, which enables the reuse of the test data and permits to carry out tests for selective and prior circuit modules.

With the above object in mind, the test-facilitating circuit of the present invention comprises a circuit of superior level of hierarchy which is constructed by connecting the circuit modules and also by taking out external nodes from predetermined circuit modules, interposed gates that are provided for each of the input and output portions of each circuit module, input gate and output gate that are provided in a wiring that connects the interposed gates with the mutual wiring as one of their ends, means for connecting the input terminal of the input gate to the input external node of the circuit module which does not belong to the circuit modules on the output side of the mutual wiring, means for connecting the output terminal of the output gate to the output external node of the circuit module that does not belong to the circuit modules on the input side of the mutual wiring, and rewritable memory means that is provided for the control terminal of each of the insertion gate, input gate, and output gate.

In the above test-facilitating circuit, test for a circuit module is carried out by activating selectively the interposed gate, input gate, and output gate that belong to the same circuit module, and by making use of the external node of other circuit module that is connected to the external node, input gate, and output gate which belong to the circuit module in question.

BRIEF DESCRIPTION OF THE DRAWINGS

These and other objects, features, and advantages of the present invention will be more apparent from the following description of the preferred embodiments taken in conjunction with the accompanying drawings in which.

DESCRIPTION OF THE PREFERRED EMBODIMENTS

Figure 1:
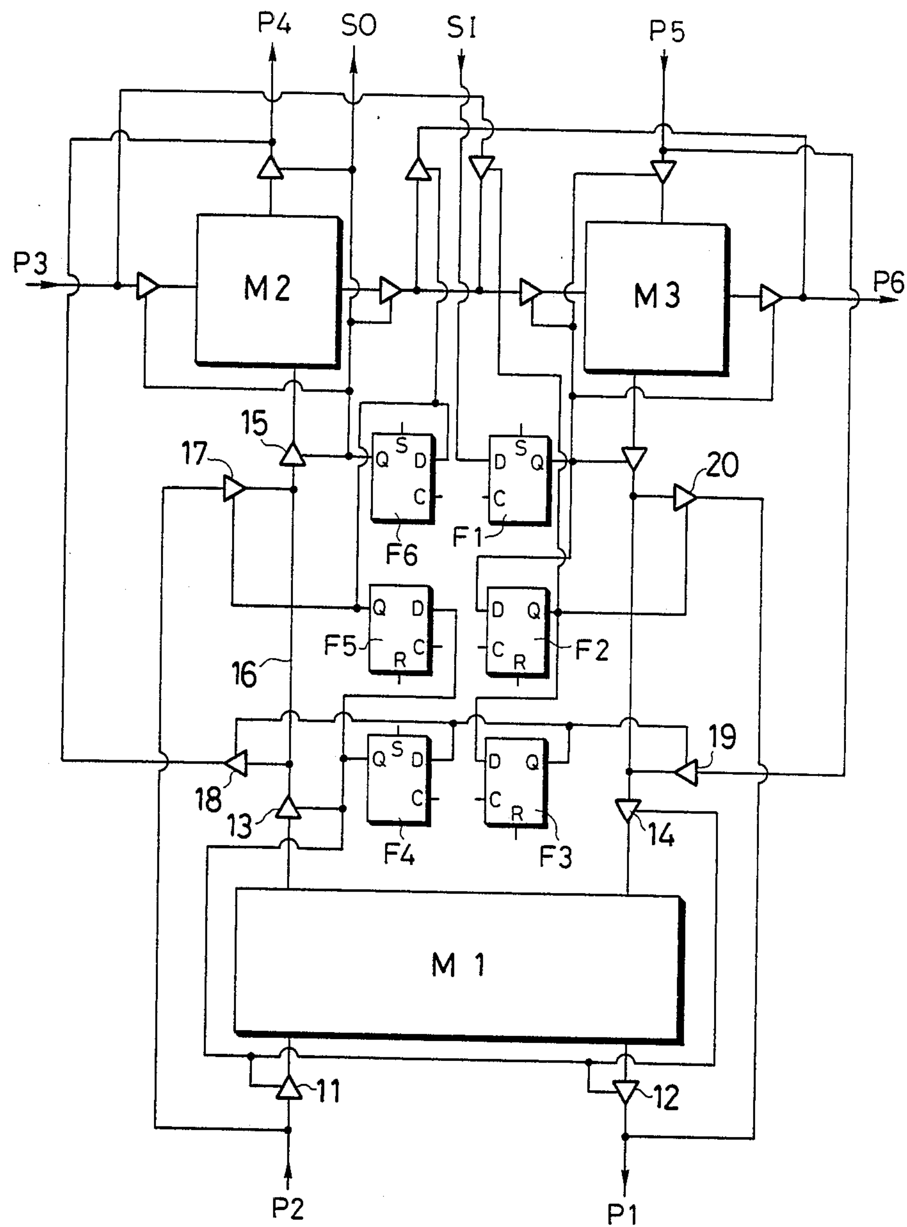
FIG. 1 is a circuit diagram for an embodiment of the test-facilitating circuit of the present invention.

Referring to FIG. 1, the chip comprises modules $M_1$, $M_2$, and $M_3$, and $P_1$ to $P_6$, SI and SO are external terminals (external nodes). The proper operation of the chip is shown corresponding to FIG. 2. Accordingly, $P_1$ is the output side node of the circuit module $M_1$ and $P_2$ is the input side node of $M_1$, $P_3$ and $P_4$ are the input and output side nodes, respectively, of $M_2$, and $P_5$ and $P_6$ are the input and output side nodes, respectively, of $M_3$.

Figure 2:
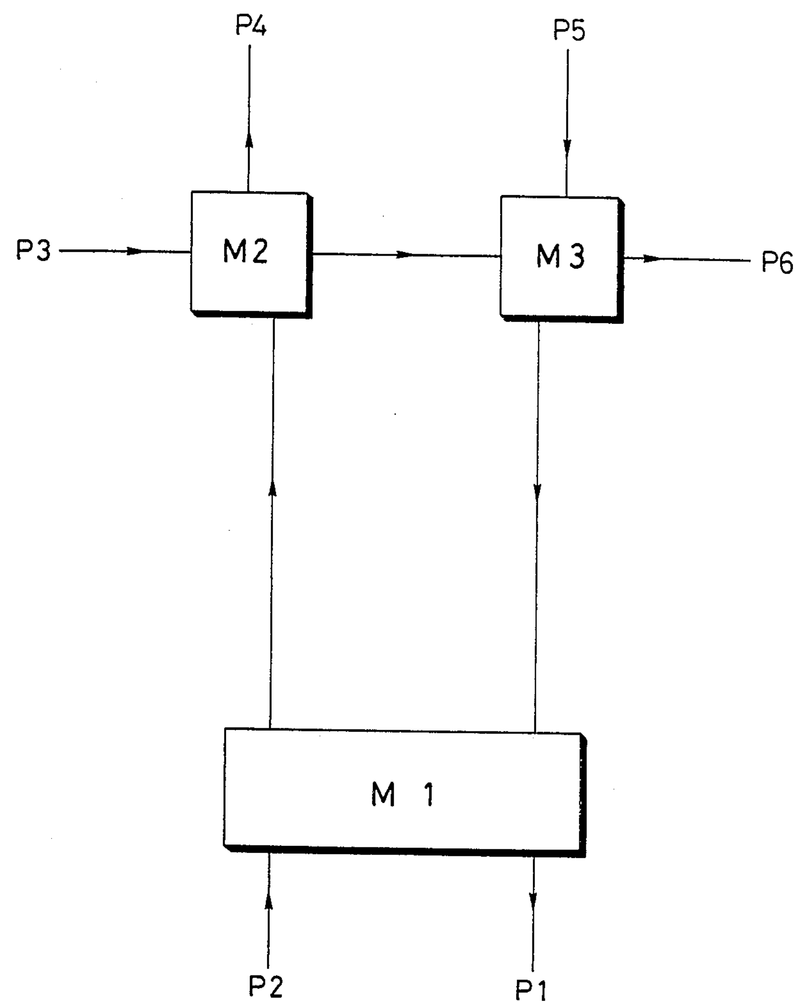
FIG. 2 is an equivalent circuit diagram in the ordinary operation for the circuit of FIG. 1.

In addition, there are provided buffer gates in the circuit. Taking $M_1$ as an example, the situation is as follows. Namely, for $P_1$ and $P_2$ there are provided interposed buffer gates 11 and 12. The buffer gates are provided so as to transmit signals when the gates are turned on in the signal direction (the direction from $M_3$ to $M_1$), as shown in FIG. 2. For the portion connecting $M_1$ and $M_2$ there is provided an interposed buffer gate 13 on the output side of $M_1$, and for the portion connecting $M_1$ and $M_3$ there is provided an interposed buffer 14 on the input side of $M_1$.

Further, in the portion connecting $M_1$ and $M_2$, an input buffer gate 17 and an output buffer gate 18 are provided in the mutual wiring 16 that connects the interposed buffer gate 13 and an interposed buffer gate 15 on $M_2$ side. Similarly, on the side of $M_1$ and $M_3$ there are provided an input buffer gate 19 and an output buffer gate 20. For testing $M_1$, there are required $P_1$ and $P_2$, $M_1$ - $M_2$ line, and $M_1$ - $M_3$ line. Accordingly, the output gate 18 is connected to the external node $P_4$ of $M_2$, and the input buffer gate 19 is connected to the external node $P_5$ of $M_3$.

Now, the interposed gates 11 to 14 are to be activated simultaneously in testing $M_1$ so that their gate control terminals are connected commonly to the output terminal Q of a flip-flop $F_4$. On the other hand, the input buffer gate 19 and the output buffer gate 18 are electrically connected commonly to the output terminal Q of a flip-flop $F_3$. These flip-flops are connected in series, and form a shift register that has SI as the data-in and SO as the data-out. For the flip-flops $F_1$ to $F_6$, there are provided a set terminal S if it is for insertion, as in $F_4$, and a reset terminal R if it is for input output and buffer gates as in $F_3$. Wiring (not shown) that connects terminals R mutually and wirings that connect terminals S mutually. In addition, each flip-flop is provided with a clock terminal C. Consequently, after completion of a circuit module test by the shift register in the test mode, it is arranged to be able to write "0" by R's and "1" by S's at one time in order to turn off the input and output buffer gates and turn on the interposed buffer gates in the ordinary operation. This is done to enhance the efficiency of the buffer gates, because the conditions of each buffer gate is unique in the ordinary operation, whereas these buffer gates can take on various values in the test mode. In addition, D is the data input terminal for the flip-flop.

Next, the test operation will be described.

First, description will be given on the assumption that the module $M_1$ is a newly designed module to be tested.

Prior to the actual test, the operation of the shift register will be confirmed. For that purpose, a set signal is inputted first. Namely, by operating S's and R's, "1" and "0" are written respectively for $F_1$ to $F_6$. Then, the shift register is operated by turning off the set signal and inputting the clock signal to confirm that a correct value is outputted from SO. Next, by inputting data to SI and outputting from SO after carrying out ordinary shift register operation, the overall operation of the shift register is confirmed. Now, it is ready to start the test for $M_1$.

First, the state of the flip-flops is set by shifting in from SI. That is, "1" is input to $F_3$ and $F_4$. By this, there appears "1" at respective Q terminals. Therefore, the buffer gates 11 to 14 18, and 19 are turned on. The remaining buffer gates are turned off.

Then, by inputting data from the external nodes $P_2$ and $P_5$, the result of operation of $M_1$ is output from $P_1$ and $P_4$. After completion of the test for $M_1$, the test for $M_2$ will be skipped since it is assumed to be an existing circuit. $M_3$ is a newly designed circuit so that it will be tested similar to $M_1$. In this manner, it becomes possible to analyze the defects in $M_1$ and $M_3$. Since $M_2$ is an existing circuit module, it will be tested last using the test data obtained in the past. In this manner, the operation of $M_1$ to $M_3$ can be accomplished.

Next, the operation of the mutual wirings can be confirmed if so desired. For instance, for the wiring 16 between the buffer gates 13 and 15, analogous to what was described in connection with the test on $M_1$, only the input buffer gate 17 and the output buffer gate 18 are turned on, to carry out a conduction test using the external nodes $P_2$ and $P_4$.

In Table 1 is shown the relationship among the flip-flops $F_1$ to $F_6$, and the external nodes $P_1$ to $P_6$ used, for various test operations.

TABLE 1

| | $F_1$ | $F_2$ | $F_3$ | $F_4$ | $F_5$ | $F_6$ | External Terminals Used |
|---|---|---|---|---|---|---|---|
| $M_1$ Test | 0 | 0 | 1 | 1 | 0 | 0 | $P_1$, $P_2$, $P_4$, $P_5$ |
| $M_2$ Test | 0 | 0 | 0 | 0 | 1 | 1 | $P_2$, $P_3$, $P_4$, $P_6$ |
| $M_3$ Test | 1 | 1 | 0 | 0 | 0 | 0 | $P_1$, $P_3$, $P_5$, $P_6$ |
| $M_1/M_2$ Connection Test | 0 | 0 | 1 | 0 | 1 | 0 | $P_2$, $P_4$ |
| $M_2/M_3$ Connection Test | 0 | 1 | 0 | 0 | 1 | 0 | $P_3$, $P_6$ |
| $M_3/M_1$ Connection Test | 0 | 1 | 1 | 0 | 0 | 0 | $P_1$, $P_5$ |

To operate the system according to the ordinary operational mode after completion of the tests, the interposed buffer gates are turned on and the input and output buffer gates are turned off by the operation of the set terminals S and the reset terminals R. In this example, $F_1$, $F_4$, and $F_6$ are turned on and $F_2$, $F_3$, and $F_5$ are turned off.

Although the case of two levels of hierarchy was discussed in the above embodiment, there occur frequently in practice the cases of multiple levels. Namely, the entire circuit of FIG. 1 corresponds to each one of the circuit modules $M_1$ to $M_3$. In such a case of multi-levels of hierarchy, it is necessary to lead the external nodes in FIG. 1 to the external nodes of the highest level circuits For example, suppose that the entire circuit described in the foregoing corresponds to $M_1$ in the highest level circuit. In such a case, for the testing of the lowest level module, it only needs to activate the buffer gates 11 to 14, 18, and 19 in order to connect the external nodes of the lowest level module to $P_1$, and connect the external nodes of the entire circuit to the external nodes of the highest level circuit.

In such a case of multi-levels, it is possible to test the blocks of the intermediate levels first, and then check each of the circuit modules in the blocks where defect was discovered.

In order to make the hierarchy of tests feasible there is required a means which enables the test for separate modules for all levels.

Figure 3:
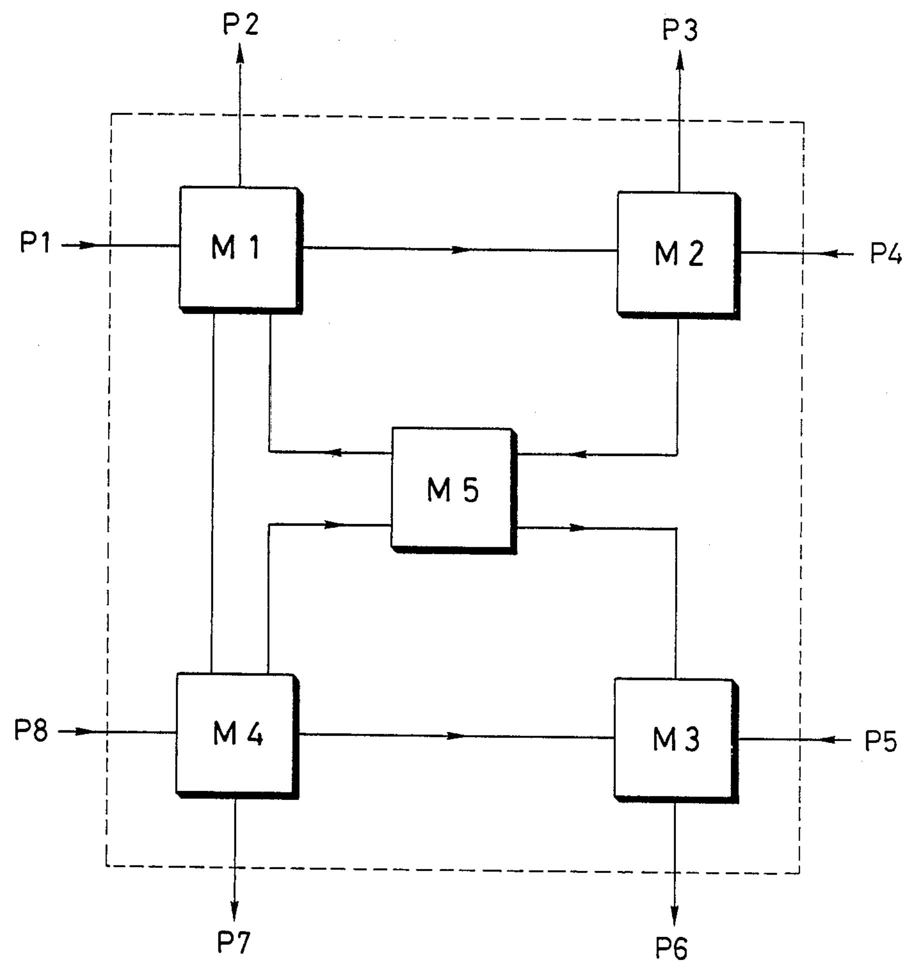
FIG. 3 is a block diagram of an example of circuit used for illustrating the concept of the present invention.
Figure 4:
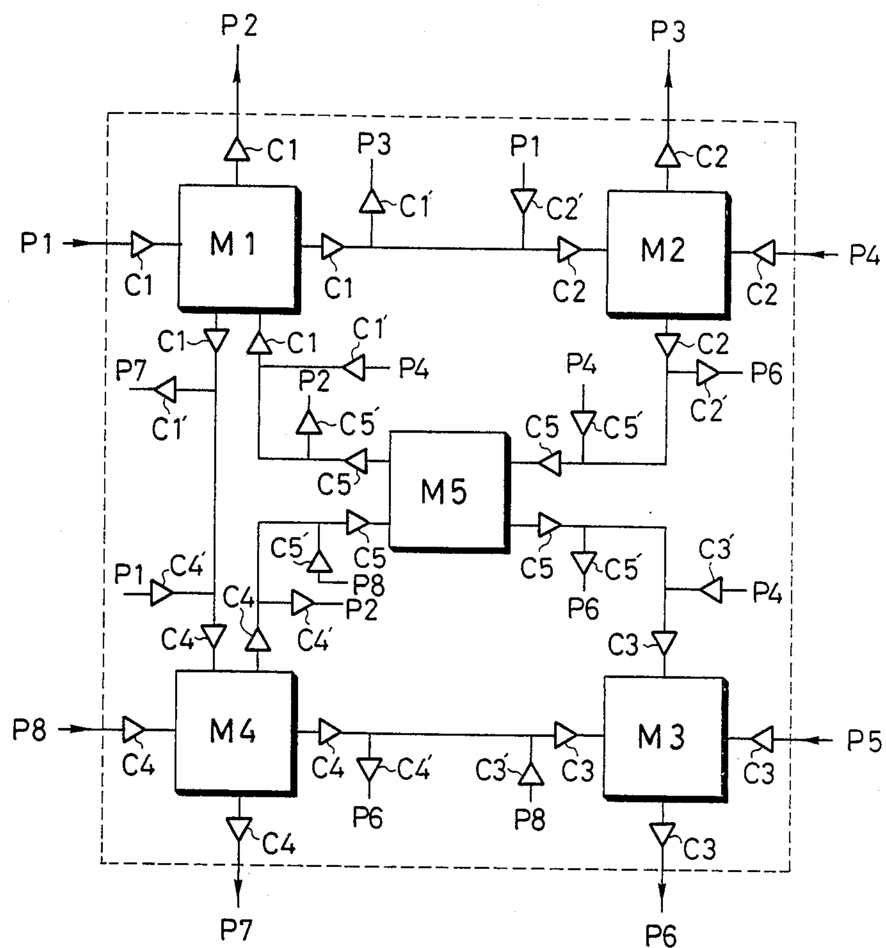
FIG. 4 is a circuit diagram for illustrating the means for test-facilitating the circuit of FIG. 3.

In FIG. 3 is shown the case where the module is composed of lower level modules $M_1$ to M5, in which $P_1$, $P_4$, $P_5$, and $P_8$ are input terminals from the outside of the module, and $P_2$, $P_3$, $P_6$, and $P_7$ are output terminals to the outside of the module. Test for separate modules means to test the lower level modules $M_1$ to $M_5$ by the use of the module terminals $P_1$ to $P_8$. For that purpose, buffer gates $C_1$, $C_2$, $C_3$, and $C_4$ are inserted to the inputs and the outputs of the lower level modules $M_1$ to $M_5$, as shown in FIG. 4.

Further, wirings that are closed within the module are connected to the module terminals via the buffer gates $C_1'$, $C_2'$, $C_3'$, and $C_4'$. The module terminals to be connected are selected so as not to obstruct the tests for separate modules. In other words, they are connected to module terminals from lower level modules other than the lower level module to which the buffer gate in question belongs. In FIG. 4 is shown an example of selection of module terminals.

The ordinary operation modes and the test modes for separate modules are selected by the conduction and nonconduction of the buffer gates. As the signals for controlling the buffer gates, use is made of the outputs of the flip-flops in order to minimize the increase in the number of external terminals, as will be described in detail later.

The values for the ordinary operation modes, the test modes for lower level modules, and the connection tests between the lower level modules, of the control signals for the buffer gates are given Table 2. In Table 2, the conducting state is assigned to the value "1" and the nonconducting state is assigned to the value "0."

TABLE 2

| | $C_1$ | $C_1'$ | $C_2$ | $C_2'$ | $C_3$ | $C_3'$ | $C_4$ | $C_4'$ | $C_5$ | $C_5'$ | Module Terminals Used |
|---|---|---|---|---|---|---|---|---|---|---|---|
| Ordinary Operation | 1 | 0 | 1 | 0 | 1 | 0 | 1 | 0 | 1 | 0 | $P_1$–$P_8$ |
| $M_1$ Test | 1 | 1 | 0 | 0 | 0 | 0 | 0 | 0 | 0 | 0 | $P_1$, $P_2$, $P_3$, $P_4$, $P_7$ |
| $M_2$ Test | 0 | 0 | 1 | 1 | 0 | 0 | 0 | 0 | 0 | 0 | $P_1$, $P_3$, $P_4$, $P_6$ |
| $M_3$ Test | 0 | 0 | 0 | 0 | 1 | 1 | 0 | 0 | 0 | 0 | $P_4$, $P_5$, |

TABLE 2-continued

| | $C_1$ | $C_1'$ | $C_2$ | $C_2'$ | $C_3$ | $C_3'$ | $C_4$ | $C_4'$ | $C_5$ | $C_5'$ | Module Terminals Used |
|---|---|---|---|---|---|---|---|---|---|---|---|
| | | | | | | | | | | | $P_6$, $P_8$ |
| $M_4$ Test | 0 | 0 | 0 | 0 | 0 | 0 | 1 | 1 | 0 | 0 | $P_1$, $P_2$, $P_6$, $P_7$, $P_8$ |
| $M_5$ Test | 0 | 0 | 0 | 0 | 0 | 0 | 0 | 0 | 1 | 1 | $P_2$, $P_4$, $P_6$, $P_8$ |
| $M_1/M_2$ Connection Test | 0 | 1 | 0 | 1 | 0 | 0 | 0 | 0 | 0 | 0 | $P_1$, $P_3$ |
| $M_2/M_5$ Connection Test | 0 | 0 | 0 | 1 | 0 | 0 | 0 | 0 | 0 | 1 | $P_4$, $P_6$ |
| $M_5/M_3$ Connection Test | 0 | 0 | 0 | 0 | 0 | 1 | 0 | 0 | 0 | 1 | $P_4$, $P_6$ |
| $M_3/M_5$ Connection Test | 0 | 0 | 0 | 0 | 0 | 1 | 0 | 1 | 0 | 0 | $P_6$, $P_8$ |
| $M_4/M_5$ Connection Test | 0 | 0 | 0 | 0 | 0 | 0 | 0 | 1 | 0 | 1 | $P_2$, $P_8$ |
| $M_4/M_1$ Connection Test | 0 | 1 | 0 | 0 | 0 | 0 | 0 | 1 | 0 | 0 | $P_1$, $P_7$ |
| $M_5/M_1$ Connection Test | 0 | 1 | 0 | 0 | 0 | 0 | 0 | 0 | 0 | 1 | $P_2$, $P_4$ |

In an upper level module that contains the module shown in FIG. 3 as its lower level module, it is possible to accomplish the hierarchy of tests by repeating the same kind of method as described in the foregoing.

Figure 5:
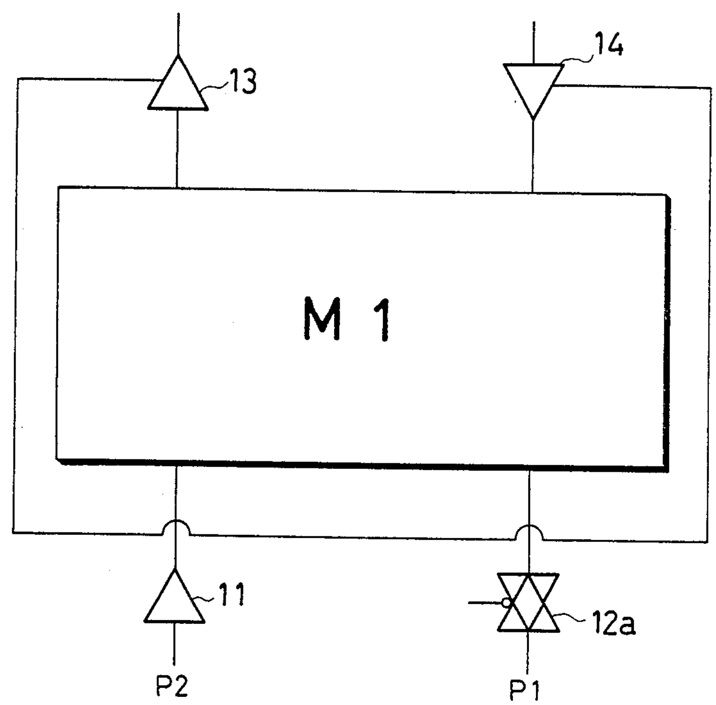
FIG. 5 is a circuit diagram in which the output interposed gate in the circuit portion of FIG. 1 is replaced by a bidirectional interposed gate.

Although in the foregoing description, the direction of each signal is limited to the direction which is fixed, the present invention can be applied as well to the case of signal with bidirections. Thus, for instance, when $P_1$ in FIG. 1 is a bidirectional input-output terminal and bidirectional signals are used within the module $M_1$, the output interposed gate of FIG. 1 needs only be replaced by a bidirectional interposed gate as shown by the symbol 12*a* in FIG. 5.

According to the foregoing method, the module tests can be reduced to the tests for individual lower level modules and the connection tests between the lower level modules, so that not only the preparation of the test data, including the reuse of the existing test data, but also the specification of the defective portions, can be facilitated.

What is claimed is:

1. A test-facilitating circuit for functionally testing circuit modules comprising:

circuit means of a superior structural hierarchy constructed by connecting circuit modules therebetween and by disconnecting external node means from predetermined circuit modules;

interposed gate means provided in the input and output portions of each circuit module for inputting and outputting signals and performing a functional test to select a specific module;

input and output gate means connected in a mutual wiring between said interposed gate means, and disposed at one end of the mutual wiring, said input-output gate means inputting and outputting signals for performing the functional test to select the specific module, the connections between the circuit modules being tested on the basis of the interposed gate means and the input-output gate means;

means for connecting an input terminal of said input-output gate means to the input external node means of the circuit module which does not belong to the circuit modules on the output side of the mutual wiring;

means for connecting an output terminal of said input-output gate means to an output external node means of the circuit module which does not belong to the circuit modules on the input side of the mutual wiring; and rewritable memory means provided at a control terminal of each of the interposed gate means and the input-output gate means and disposed outside the circuit means.

2. The test-facilitating circuit as claimed in claim 1 wherein each said memory means is a flip-flop.

3. The test-facilitating circuit as claimed in claim 2 wherein a shift register connects said flip-flops in series.

4. The test-facilitating circuit as claimed in claim 3 wherein there is provided for each-flip-flop a set terminal or a reset terminal corresponding to an interposed gate means or an input-output gate means.

5. The test-facilitating circuit as claimed in claim 1 wherein the interposed gate means that belong to the same circuit module are controlled by identical memory means.

6. The test-facilitating circuit as claimed in claim 1 wherein input-output gate means that belong to the same circuit module are controlled by identical memory means.

7. The test-facilitating circuit as claimed in claim 1 wherein separate from the memory means that commonly controls the interposed means that belong to the same circuit module, there is provided a memory means that controls commonly the input-output gate means that belong to the same circuit module.

8. The test-facilitating circuit as claimed in claim 1 wherein the input-output gate means is constructed by buffer gates.

9. The test-facilitating circuit as claimed in claim 1 wherein the interposed gate means is constructed by bidirectional interposed gates.

10. The test-facilitating circuit as claimed in claim 1 wherein said means connected to an input external node includes a buffer gate connected to the circuit module and a flip-flop connected to the buffer gate.

11. The test-facilitating circuit as claimed in claim 1 wherein said means connected to an output external node includes a buffer gate connected to the circuit module and a flip-flop connected to the buffer gate.

12. A test method carried out by setting a circuit means of a superior level in hierarchy constructed by connecting circuit modules and by disconnecting external node means from predetermined circuit modules;

interposed gate means provided for the input-output portions of each circuit module;

input-output gate means provided for a wiring for said interposed gate means, with the mutual wiring as one terminal;

means for connecting the input terminal of the input-output gate means to the input external node means of the circuit module that does not belong to the circuit modules on the output side of the mutual wiring; and means for connecting the output terminal of the input-output gate means to the output external node means of the circuit module that does not belong to the circuit modules on the input side of the mutual wiring, said method comprising the steps of:

selectively activating the interposed gate means and input-output gate means that belong to the same circuit module; and carrying out test on a circuit module by the use of external node means of other circuit modules that are connected to the external node means and input-output gate means that belong to the circuit module.

13. The test method as claimed in claim 12 wherein rewritable memory means is provided for a control terminal of each of the interposed gate means and the input-output gate means, whereby the memory means comprising a flip-flop, a set terminal or a reset terminal being provided for each flip-flop according to whether the control operates as an interposed gate means or an inputted-output gate means, and control data are input to each gate means by the operation of a shift register, in a testing circuit, whereas the interposed gate means alone are activated by a control en masse of the set and reset terminals, in the ordinary operation of the circuit.

14. The test method as claimed in claim 13 wherein the shift register is tested by inputting data, in advance, to the flip-flops through the set and reset terminals, and scanning out the data, followed by scanning in and out of new data for the shift register.

15. The test method as claimed in claim 12 wherein a newly designed circuit module is tested selectively or with priority.

16. The test method as claimed in claim 12 wherein a circuit of more superior level in hierarchy which has the superior level circuit as a circuit module is constructed by similar procedure, and the test of the most inferior circuit module is carried out by making use of the external node means of the more superior circuit module which is the external node means of the most superior circuit, via the interposed gate means, via the interposed gate means and input gate means, or via the interposed gate means and output gate means, that are further connected to the external mode means of the superior circuit.

17. The test method as claimed in claim 12 wherein test of a mutual wiring is carried out by the use of input-output gate means that belong to the same mutual wiring.

18. The test method as claimed in claim 12 wherein the interposed gate means comprises a bidirectional interposed gate.

* * * * *